(12) United States Patent
Poh

(10) Patent No.: US 8,125,756 B2
(45) Date of Patent: Feb. 28, 2012

(54) ELECTROSTATIC HOLDING APPARATUS, VACUUM ENVIRONMENTAL APPARATUS USING IT AND JOINING APPARATUS

(75) Inventor: Fow-Lai Poh, Kawachi-gun (JP)

(73) Assignee: Tsukuba Seiko Ltd., Kawachi-gun (JP)

( * ) Notice: Subject to any disclaimer, the term of this patent is extended or adjusted under 35 U.S.C. 154(b) by 653 days.

(21) Appl. No.: 12/224,859

(22) PCT Filed: Mar. 9, 2007

(86) PCT No.: PCT/JP2007/054642
§ 371 (c)(1),
(2), (4) Date: Sep. 25, 2008

(87) PCT Pub. No.: WO2007/102598
PCT Pub. Date: Sep. 13, 2007

(65) Prior Publication Data
US 2009/0021885 A1    Jan. 22, 2009

(30) Foreign Application Priority Data

Mar. 9, 2006   (JP) .................. 2006-064020

(51) Int. Cl.
*H01L 21/683* (2006.01)
*H01T 23/00* (2006.01)

(52) U.S. Cl. ......... 361/234; 361/230; 361/233; 279/128

(58) Field of Classification Search .................. 361/234, 361/233, 230; 279/128
See application file for complete search history.

(56) References Cited

U.S. PATENT DOCUMENTS

| | | | | |
|---|---|---|---|---|
| 5,933,314 A * | 8/1999 | Lambson et al. | ............. | 361/234 |
| 6,095,084 A * | 8/2000 | Shamouilian et al. | .... | 118/723 E |
| 6,327,540 B1 * | 12/2001 | Miyano et al. | .................. | 702/57 |
| 6,416,822 B1 * | 7/2002 | Chiang et al. | ................. | 427/561 |
| 6,490,145 B1 * | 12/2002 | Kholodenko et al. | ........ | 361/234 |
| 6,562,187 B2 * | 5/2003 | Winniczek et al. | ...... | 156/345.24 |
| 6,846,213 B2 * | 1/2005 | Sato | ................................. | 445/6 |
| 6,923,979 B2 * | 8/2005 | Fotland et al. | ................ | 424/439 |
| 2007/0211232 A1 * | 9/2007 | Phillips et al. | .................. | 355/30 |

FOREIGN PATENT DOCUMENTS

| | | |
|---|---|---|
| JP | A-2002-357838 | 12/2002 |
| JP | A-2004-120921 | 4/2004 |
| JP | A-2004-176124 | 6/2004 |
| JP | A-2004-335811 | 11/2004 |
| JP | A-2006-097065 | 4/2006 |
| WO | WO 2006/123680 A1 | 11/2006 |

OTHER PUBLICATIONS

U.S. Appl. No. 11/920,771, filed on Nov. 20, 2007 in the name of Fow-Lai Poh.

* cited by examiner

*Primary Examiner* — Jared Fureman
*Assistant Examiner* — Zeev V Kitov
(74) *Attorney, Agent, or Firm* — Oliff & Berridge, PLC

(57) ABSTRACT

An electrostatic holding apparatus is configured to electrostatically hold objects (W1, W2) to be held by applying a predetermined high voltage to a plurality of electrode groups (112a, 112b) as a holding part. A high-voltage generating part or high voltage generating source (114) to convert from a low voltage to a predetermined high voltage necessary to hold the objects electrostatically is disposed on each of electrode modules (110). The high-voltage generating part (114) is hermetically closed or sealed. The high-voltage generating part may include a voltage amplifying circuit. The high-voltage generating part may include a battery and a voltage amplifying circuit.

3 Claims, 3 Drawing Sheets

ELECTROSTATIC HOLDING APPARATUS, VACUUM ENVIRONMENTAL APPARATUS USING IT AND JOINING APPARATUS

FIELD OF THE INVENTION

The present invention relates to an electrostatic holding apparatus to hold an object, a vacuum environmental apparatus using the electrostatic holding apparatus and an alignment apparatus to combine objects.

BACKGROUND ART

A vacuum chuck as a holding apparatus to hold an object is conventionally used in general, but if the object is a thin plate, there is a problem that a periphery of the thin plate is deflected. In contrast, in an electrostatic holding apparatus such as an electrostatic chuck, because the object can be hold by an electrostatic force of the entirety of an electrode surface, even if the thin plate is handled to hold, a periphery of the thin plate is not deflected (for reference, see Patent Documents 1 and 2).

In the aforementioned electrostatic chuck, a holding part to hold the object is provided on a basic plate, and the holding part includes electrode element groups which provide a pair of positive and negative charges and an insulative layer fixed to the basic plate to cover the electrode element groups.

In such a structure, the object is held on a holding surface which is a surface of the insulative layer by an electrostatic attractive force induced between the object and the holding surface by applying a high voltage to the electrode element groups through a switch. When the switch is turned off, the electrostatic attractive force is removed to be disengaged the object from the holding surface. Thereby, the electrostatic chuck can attract an object such as a conductor, semi-conductor or high resistance by the electrostatic attractive force and allows the object to load or unload. Incidentally, an electrostatic chuck to hold an object in a floating state by controlling an attractive force by means of a control circuit or the like also is developed.

In such an electrostatic chuck, because a holding force for the object can be maintained even under a reduced pressure, the electrostatic chuck is applied to an alignment apparatus for substrate or joining apparatus for substrate or the like in a manufacturing process of a panel of a liquid display apparatus requiring an assembly under a reduced pressure (for reference, see Patent Documents 3 and 4).

For example, in an alignment apparatus described in patent document 3, an upper substrate W1 which is a workpiece of a mask or the like is configured to be held by an electrostatic attractive force of a substrate holder (electrostatic chuck), and a lower substrate W2 aligned together with the upper substrate W1 is configured to be supported on a lower stage approximately in a horizontal state.

The electrostatic chuck includes a flat plate-like basic member which is connected to an actuator such as a motor or the like and capable of moving in directions of x, y and z (vertical) axes and θ (rotational direction in an x-y plane). The basic member has a lower surface configured to fix a pair of positive and negative electrode element groups covered by an insulative material. A positive voltage and a negative voltage are applied to the electrode element groups and thereby the upper substrate W1 is electrostatically attracted to a holding surface which is a lower surface of the insulative material.

On the other hand, the electrostatic chuck/or stage is provided with a hole to monitor an aligned mark by a monitoring camera. Thereby, the lower substrate W2 is placed and fixedly supported on the stage, the upper substrate W1 is transported to the holding surface by means of a transporting device, and a plus V1 volt and a minus V1 volt are applied to the pair of electrode element groups. Thereby, the upper substrate W1 is electrostatically absorbed to the electrode element groups.

An alignment of the objects can be accomplished by lowering the electrostatic chuck in the direction of z axis by driving the actuator, approaching (or contacting) the upper substrate W1 and the lower substrate W2, measuring an amount of displacement based on information such as an alignment mark from the camera, driving the actuator depending on the measured amount of displacement and moving the upper substrate W1 and the lower substrate W2 so that the amount of displacement in the directions of x and y axes and θ is eliminated.

Patent Document 1: Japanese Patent Application Publication 2004-335811 (FIG. 11)
Patent Document 2: Japanese Patent Application Publication 2004-120921 (paragraph 0012)
Patent Document 3: Japanese Patent Application Publication 2004-176124 (FIGS. 3, 4)
Patent Document 4: Japanese Patent Application Publication 2002-357838

DISCLOSURE OF THE INVENTION

Problems to be Solved by the Invention

However, if the objects are aligned or joined by use of the conventional alignment apparatus for substrate and the conventional joining apparatus for substrate, as mentioned above, when an electrode surface is failed for any reasons, it is required that the failed electrode surface is repaired. The breakage failure of the electrode surface often occurs at the time of start up of the alignment apparatus or the joining apparatus or stipulation of conditions for manufacturing. In addition, the failed electrode surface is repaired in a state where the electrostatic holding part is attached to or detached from the alignment apparatus or the joining apparatus.

In a master substrate of a recent liquid crystal display apparatus, for example, a glass substrate in the seventh generation has a surface size of 1.9 m by 2.2 m, but is being developed to a large substrate of the eighth generation having a surface size of 2.5 m by 2.5 m or more. It is required that the holding surface of the electrostatic chuck also is increased in size as a size of the substrate increases. However, in a device to produce a master substrate or the like of a liquid crystal display apparatus (LCD), it is necessary to align and combine accurately substrates. In addition, it is requested that in the holding surface of the electrostatic chuck, a flatness of an insulative layer having a thin thickness of about 60 μm is maintained accurately to become about several μm. Such an electrostatic holding surface is expensive, and is usually difficult to repair in an assembled state.

Therefore, it is considered to divide a holding surface having a large area into a plurality of sections and remove and repair only a module having a failed electrode surface. However, if the number of the divided modules is increased, a large number of lead wires to supply a voltage to each module are required. It is required that these lead wires are tied in a bundle-like state to connect the bundle to a high-voltage generating part disposed in an exterior portion of a vacuum chamber. Accordingly, workings to release the tied lead wires and tie them again based on the number of modules are required, and thereby requiring great care.

In contrast, if the lead wires are connected through connectors disposed in the vacuum chamber to the high-voltage generating apparatus, the workings to release the tied lead wires and tie them again are not required. However, there is possibility that charges in the connectors are flowed out rapidly in accordance with flow of air occurred by high-speed decompression in the vacuum chamber to generate electric leak. Therefore, the connectors as the contacts with the high-voltage generating apparatus cannot be disposed in the vacuum chamber. Consequently, as the number of the electrode modules is increased, complication handling the lead wires is increased depending on the number of the modules.

Therefore, an object of the present invention is to provide an electrostatic holding apparatus capable of exchanging easily even if the number of electrode modules is increased, a vacuum environmental apparatus and a joining apparatus using the electrostatic holding apparatus.

Means of Resolving the Problems

To accomplish the above object, an electrostatic holding apparatus according to one embodiment of the present invention includes a plurality of electrode modules, each of which including a holding surface and configured to electrostatically hold an object on the holding surface, and a high-voltage generating part provided on each of the plurality of electrode modules and configured to convert from a low voltage to a predetermined high voltage necessary to hold electrostatically the object.

Here, the high-voltage generating part is hermetically sealed.

In one embodiment, the high-voltage generating part includes a voltage amplifying circuit.

The high-voltage generating part may include a voltage amplifying circuit.

The high-voltage generating part may include a battery and a voltage amplifying circuit, in this case, a switch may be disposed between the battery and the voltage amplifying circuit to control the switch from exterior.

It, also, is possible to provide a connector which is for connecting to a low voltage source and supplies a low voltage to the high-voltage generating part and provide a connector which is for controlling a voltage and controls the high-voltage generating part.

If the aforementioned electrostatic holding apparatus is used, even if vacuuming is executed at a high speed in a state where the electrostatic holding apparatus is operated, because electric leak does not occur, the electrostatic holding apparatus can be used for various vacuum environmental apparatuses or joining apparatuses for substrate.

Effect of the Invention

According to the present invention, even if the number of the electrode modules is increased, an electrostatic holding apparatus capable of exchanging easily, and a vacuum environmental apparatus and an alignment apparatus or a joining apparatus, using the electrostatic holding apparatus.

DESCRIPTION OF REFERENCE NUMBER

Figure 1:
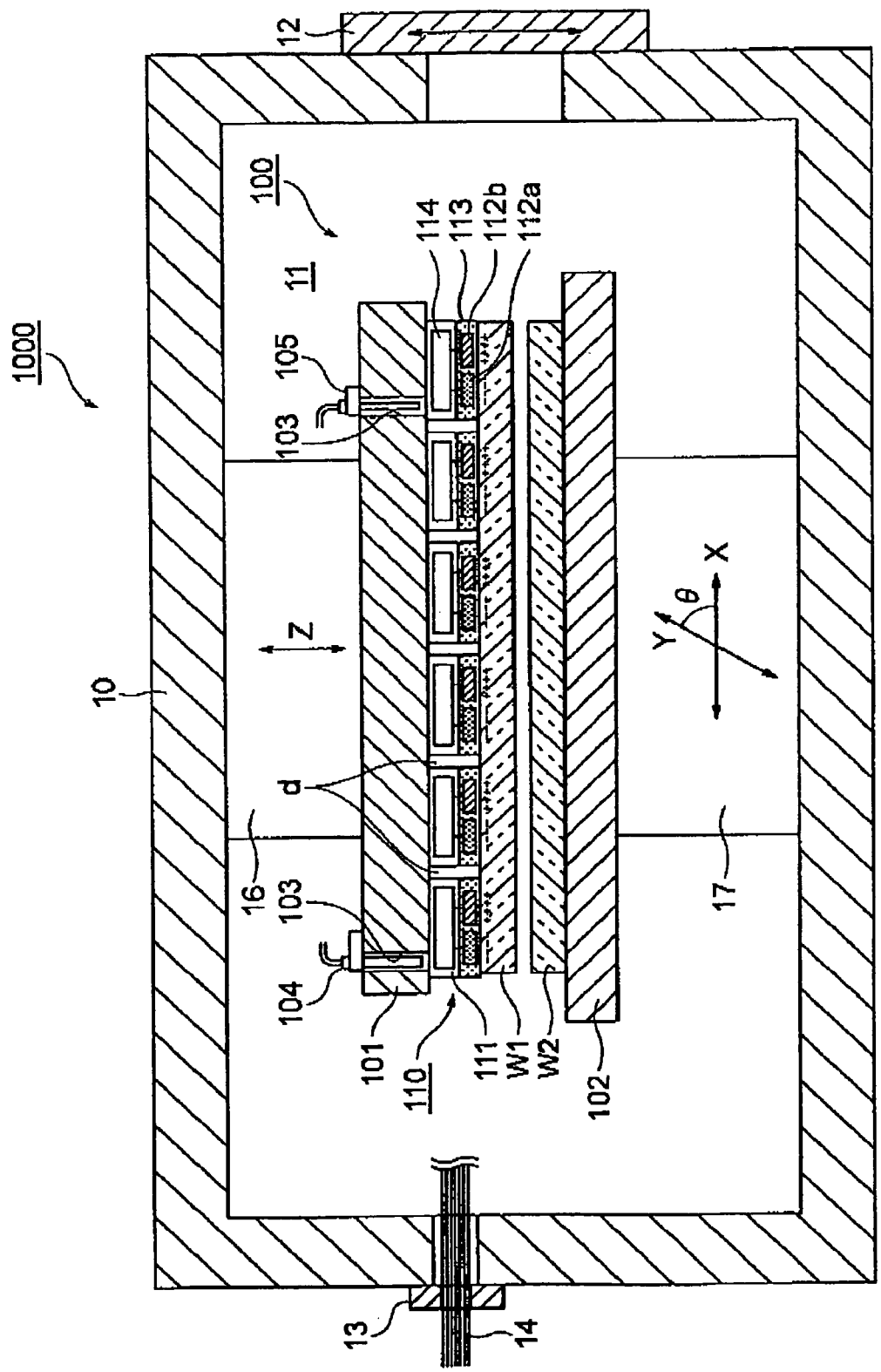
FIG. 1 is a sectional configuration diagram showing a concept of a joining apparatus according to a first embodiment of the present invention, with the joining apparatus sectioned in a perpendicular section to an electrode surface.

1000: joining apparatus
2000: joining apparatus
W1: upper substrate
W2: lower substrate
d: interval
10: wall body
11: joining chamber (vacuum chamber)
12: door
13: flange part
14: lead wire (low voltage or control signal)
15: connector
16: upper stage
17: lower stage
18: lead wire (high voltage)
100: joining apparatus
101: upper table
102: lower table
103: through hole
104: camera
105: illumination lamp
110: electrode module
111: basic member (module body)
112a, 112b: electrode element groups
113: insulative layer
113a: holding surface
114: high-voltage generating part (high-voltage generating circuit or high-voltage generating source)
115: direct-current lower voltage source
116: switch
117: control line
200: body of joining apparatus (electrostatic holding apparatus)
210: electrode module

BEST MODE FOR CARRYING OUT THE INVENTION

Embodiments to embody a best mode for carrying out the present invention will be explained in detail hereinafter with reference to the accompanying drawings.

FIG. 1 illustrates a joining apparatus 1000 according to a first embodiment of the present invention. The joining apparatus 1000 is configured to join objects as works to be processed, for example, an upper substrate W1 and a lower substrate W2 together. In this case, the upper substrate W1 is electrostatically held by an electrostatic holding apparatus 100 according to the present invention. The joining apparatus 1000 and the electrostatic holding apparatus 100 are disposed in a chamber 11 sealed by a wall body 10. The chamber 11 has an interior portion which is connected to a decompressor or vacuum generator (not shown) configured to set the interior portion in decompression or vacuum state, and a purging device (not shown) configured to purge the decompression or vacuum state and set the interior portion to atmospheric pressure.

The wall body 10 is provided with a door 12 capable of opening and closing, through the door 12, the upper substrate W1 and the lower substrate W2 can be supplied to the electrostatic holding apparatus 100 and a produced article by joining of the upper substrate and the lower substrate can be carried out. Meanwhile, the works are glass substrates, color filter substrates (CF substrates), TFT substrates or the like, but are not limited to these.

In addition, power cables, lead wires or the like to execute operation, control or the like of various devices disposed in the chamber 11 can be introduced from exterior through a flange part 13 or the like provided on the wall body 10 into the chamber 11. Only the lead wires 14 to control electrode modules within a scope of purposes of the present invention are shown in FIG. 1, the lead wires are introduced from the exterior through the flange part 13 into the chamber. Lead wires or the like used for other purposes are not shown in the drawings.

In this embodiment, the electrostatic holding apparatus 100 includes an upper table 101 which has a square shape as viewed from plane and is configured to hold the upper substrate W1 from above and a lower table 102 which has a square shape as viewed from plane and is configured to support the lower substrate W2 from below.

The upper table 101 is fixed to an upper stage 16 as an elevating device configured to be elevated by a driving device (actuator) which is not shown, and thereby a relative position of the upper substrate W1 to the lower substrate W2 can be elevated in a direction of z axis. On the other hand, the lower table 102 is fixed to a lower stage 17 as a horizontally moving device which is moved substantially horizontally by a driving device (actuator) which is not shown in the drawings, and thereby a relative position of the lower substrate W2 to the upper substrate W1 is movably set in a direction of each of x and y axes, and θ (rotational direction in a plane of x and y).

A plurality of through holes 103 (two places in the drawing) are provided in the upper table 101, and one or more cameras 104 and one or more illumination lamps which emit light such as UV line or the like are disposed at one or more of the through holes 103. The camera 104 monitors the upper substrate W1 and the lower substrate W2 through the through hole 103 to determine whether relative positional alignment of the upper substrate W1 and the lower substrate W2 is appropriate. In addition, in order to fix or temporarily adhere the upper substrate W1 and the lower substrate W2 to a light-hardening resin or the like after they are appropriately aligned, the illumination lamp 105 is configured to irradiate appropriate light to the light-hardening resin.

A plurality of electrode modules 110 each having a rectangular shape as viewed from plane are fixed to a lower surface of the upper table 101. If it is required that these electrode modules 110 have large electrostatic holding surfaces because of a large size of the upper substrate W1 to be held, the plurality of electrostatic holding surfaces are separately disposed on the lower surface of the upper table 101, and thereby maintenance of the electrode modules 110 can easily be accomplished.

In case of the electrostatic holding apparatus 100 in the embodiment, six electrode modules 110 on one side (totally thirty six) each having an electrostatic holding surface of approximately 30 cm by 30 cm are arranged at intervals (d) in directions of a plane which is surface directions of the substrate, and thereby the entire electrostatic holding surface of approximately 2 m by 2 m is formed.

Here, in the present invention, although the electrostatic holding surfaces are essentially required to be divided by the electrode modules 110, the number of division, a size of a divided module, a divided shape or the like is freely set. Thereby, the electrostatic holding surfaces and the divided modules 110 are not limited to the square shape and can be freely designed depending on a shape and a size of the substrate.

Figure 2:
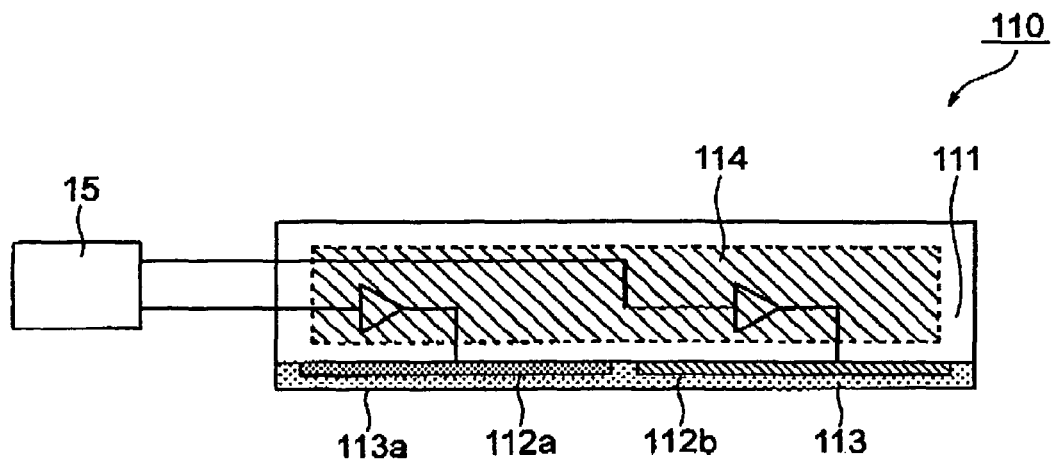
FIG. 2 is a sectional configuration diagram showing electrode modules which are main parts of the joining apparatus according to the present invention.

Each of the electrode modules 110 has a module body 111 (base member as a supporter), on a lower surface of which a pair of electrode element groups 112*a*, 112*b* are fixed, each of the electrode element groups 112*a*, 112*b* are embedded in each of insulative members 113, as shown in FIG. 2. In addition, a holding surface 113*a* which is formed in a high accurate smoothly flat surface is provided on a lower surface of each of the insulative members 113.

In the electrode modules 110 as shown in FIG. 2, a high-voltage generating part (amp) 114 configured to convert a low voltage of, for example, 100 volts or less to a high voltage is embedded in the base member 111, and therefore the high-voltage generating part 114 is sealed. An input portion of the high-voltage generating part 114 is connected to a connector 15 which may be disposed in the chamber 11 and is connected to an exterior lead wire 14. In the present invention, it is necessary to seal the high-voltage generating part 114, but it is not necessary to seal the connector 15. An output portion of the high-voltage generating part 114 is connected to each of the electrode element groups 112*a*, 112*b*.

Here, in the present invention, it is important that the high-voltage generating part 114 is sealed. In other words, it is important to reduce or remove an electric leak from the high-voltage generating part 114 if air in the chamber 11 is rapidly exhausted. In the present invention, the high-voltage generating part 114 is sealed for this purpose. It is not necessary to strictly seal the high-voltage generating part 114 if flow-out of charge by flow of air substantially does not occur. Usually, the flow-out of charge can be prevented by sealing (molding) the high-voltage generating part 114 with an insulative material (for example, insulative resin or the like), but the high-voltage generating part 114 may be sealed in a hermetically-sealed vessel. Meanwhile, a control device (not shown) to mainly control the high-voltage generating part 114 is provided.

Next, a joining process using the joining apparatus structured as mentioned above is described.

In a state where the door 12 is opened, a CF substrate and a TFT substrate which are both substrates of an LCD are carried in the chamber 11 by use of a robot (not shown).

When a low voltage is supplied from the connector through the lead wires 14 connected to a control circuit (not shown) to each of the electrode modules 110, a high voltage proportional to an input voltage sent from the control circuit, as an output voltage depending on a pattern of the input voltage is applied to each of the electrode element groups 112*a*, 112*b*. Thereby, the high voltage is applied to each of the electrode modules 110 to absorb electromatically the CF substrate or TFT substrate which is the upper substrate W1 to the holding surface 113*a* which is the lower surface of the insulative material 113.

Next, the TFT substrate (or CF substrate) which is the other lower substrate W2 is mounted on the lower table 102. Although the upper substrate W1 is in a suspended state, because an absorbing surface (holding surface 113*a*) is configured to absorb by a surface, even if a thin substrate having a large area is used to absorb, the thin substrate is prevented from generating warp.

In this state, the door 12 is closed, the chamber 11 which is in atmospheric pressure is configured to be decompressed or vacuumed to a degree of 0.1 Pa by a vacuum device (not shown). Even if the chamber 11 is rapidly decompressed or vacuumed, because the high-voltage generating part 114 is sealed, the electric leak does not occur. In addition, because the connector 15 which is a contact is merely subjected to a load of a low voltage of about 100 v or less, electric leak from the connector 15 as the contact does not occur.

An amount of displacement of the relative position of both the substrates W1 and W2 is measured by the camera 104 while confirming information such as an alignment mark or the like, and in the usual manner, the alignment of the substrates is executed by elevating operation of the upper table 101 and the moving operation of the lower table 102 in the direction of plane (x, y, θ).

In a state where the amount of displacement goes out, the actuator is driven to move the upper table 101 in the direction of z axis downwardly, and thereby the lower substrate W2 and the upper substrate W1 are abutted so that alignment operation is completed. After the alignment operation is completed, for example, ultra-violet ray emitted from the illumination lamp 105 is irradiated toward a joining portion of the upper and lower substrates to combine the both substrates W1 and W2 temporarily. Next, the substrates in which the temporary fixation is completed are taken from the chamber 11 through the door 12.

If there is generated break failure in the holding surface 113a of each of the electrode modules for any reasons, only the failed electrode module 110 including a portion of the connector 15 is removed, the failed portion is repaired in the removed state, thereafter the repaired electrode module can be attached again.

By preparing a plurality of preliminary electrode modules 110 having the same shape, only the failed electrode module 110 can be exchanged on site rapidly.

Next, a second embodiment of the joining apparatus is explained. In the joining apparatus in the second embodiment, when supplying a direct-current voltage as an input voltage supplied from the control circuit to the connector 15, a pair of positive and negative high voltages are applied to the electrode element groups 112a, 112b, and when applying an alternating voltage as the input voltage, a high alternating voltage proportional to an input pattern is applied to each of the electrode element groups 112a, 112b. Thereby, in the electrostatic holding apparatus according to the present invention, the upper substrate W1 can be held to the holding surface 113a in a contacted state, as shown in FIG. 1.

Even in the second embodiment, even if the chamber 11 is decompressed or vacuumed rapidly, similarly to the first embodiment, because the high-voltage generating part 114 is molded, electric leak is not generated. In addition, because a low voltage of about 100V or less is merely applied to the connector 15 which is a contact, the electric leak is not generated from a portion of the connector 15.

For any reasons, if the holding surface 113a is failed, only the failed electrode module including the portion of the connector 15 is removed, the failed portion is repaired in the removed state, and thereafter the repaired portion can be attached again.

By preparing a plurality of preliminary electrode modules 110 having the same shape, only the failed electrode module 110 can be exchanged on site rapidly.

Figure 3:
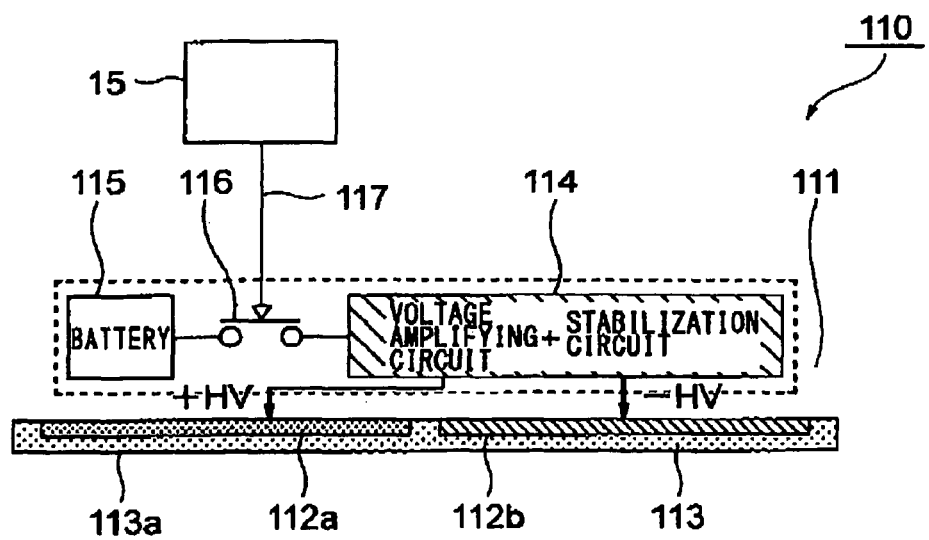
FIG. 3 is a sectional configuration diagram showing the electrode modules which are main parts of the joining apparatus according to the present invention.

Next, a third embodiment of the joining apparatus is explained. In the joining apparatus in the third embodiment, the electrode module as shown in FIG. 3 is used, instead of the electrode module as shown in FIG. 2. In the electrode module 110 as shown in FIG. 3, a direct-current low voltage source 115 having a voltage of about 100V or less such as a dry-cell battery, an accumulator battery or the like, a switch 116 and a high-voltage generating part 114 are installed in a basic member 111. The high-voltage generating part 114 according to this embodiment is composed of a voltage amplifying circuit and a stabilization circuit. The direct-current low voltage source (battery) 115 is connected through the switch 116 to the high-voltage generating part 114 (the voltage amplifying circuit and the stabilization circuit), and output portions of the high-voltage generating part are connected to the electrode element groups 112a, 112b.

The switch 116 is configured to be controlled from exterior, in this third embodiment, a control line 117 to control the switch is connected through the connector 15 to the lead wires 14 which are connected to an exterior part.

Thereby, when a control signal from the connector 15 through the lead wires 14 which are not shown is transmitted to the switch 116, the switch 116 is turned on, or off depending on the control signal. By turn on of the switch, a positive high voltage +HV is applied to the electrode element group 112a, and a negative high voltage −HV is applied to the electrode element group 112b. By a high voltage (for example, 1 kV) necessary to electrostatic holding, the upper substrate W1 is electrostatically held to the holding surface 113a which is a lower surface of the insulative material 113.

Even in this case, even if the chamber 11 is decompressed or vacuumed rapidly, because the high-voltage generating part is molded, the electric leak is not generated from the high-voltage generating part. In addition, because a control voltage which is a low voltage merely flows in the connector 15 which is the contact, electric leak from a portion of the connector 16 does not occur.

For any reasons, if the holding surface 113a is failed, only the failed electrode module 110 including the portion of the connector 15 is removed, the failed portion is repaired in the removed state, and thereafter the repaired portion can be attached again.

By preparing a plurality of preliminary electrode modules 110 having the same shape, only the failed electrode module 110 can be exchanged on site rapidly.

Furthermore, it is preferable to use a rechargeable battery as the direct-current low voltage source 115. In this case, the direct-current low voltage source 115 is configured to be rechargeable by appropriate usual practice. The charging in this case is desirably performed in a state where the electrode module 110 is attached to the basic member 111. In this case, a charging terminal may be exposed from a mold.

Meanwhile, to facilitate release operation in the basic member 111 in which the high-voltage generating part is contained, a short-circuit or the like to short between the electrode element groups 112a, 112b is provided or a potential dropping-relaxation device of electrodes configured to relax dropping of electric potential applied to the electrode element groups 112a, 112b may be used together with the short-circuit. A detail of this invention is described in, for example, Japanese Patent Application No. 2005-147637 owned by the applicant of the present application.

Next, a fourth embodiment of the joining apparatus is explained with reference to FIG. 4.

Figure 4:
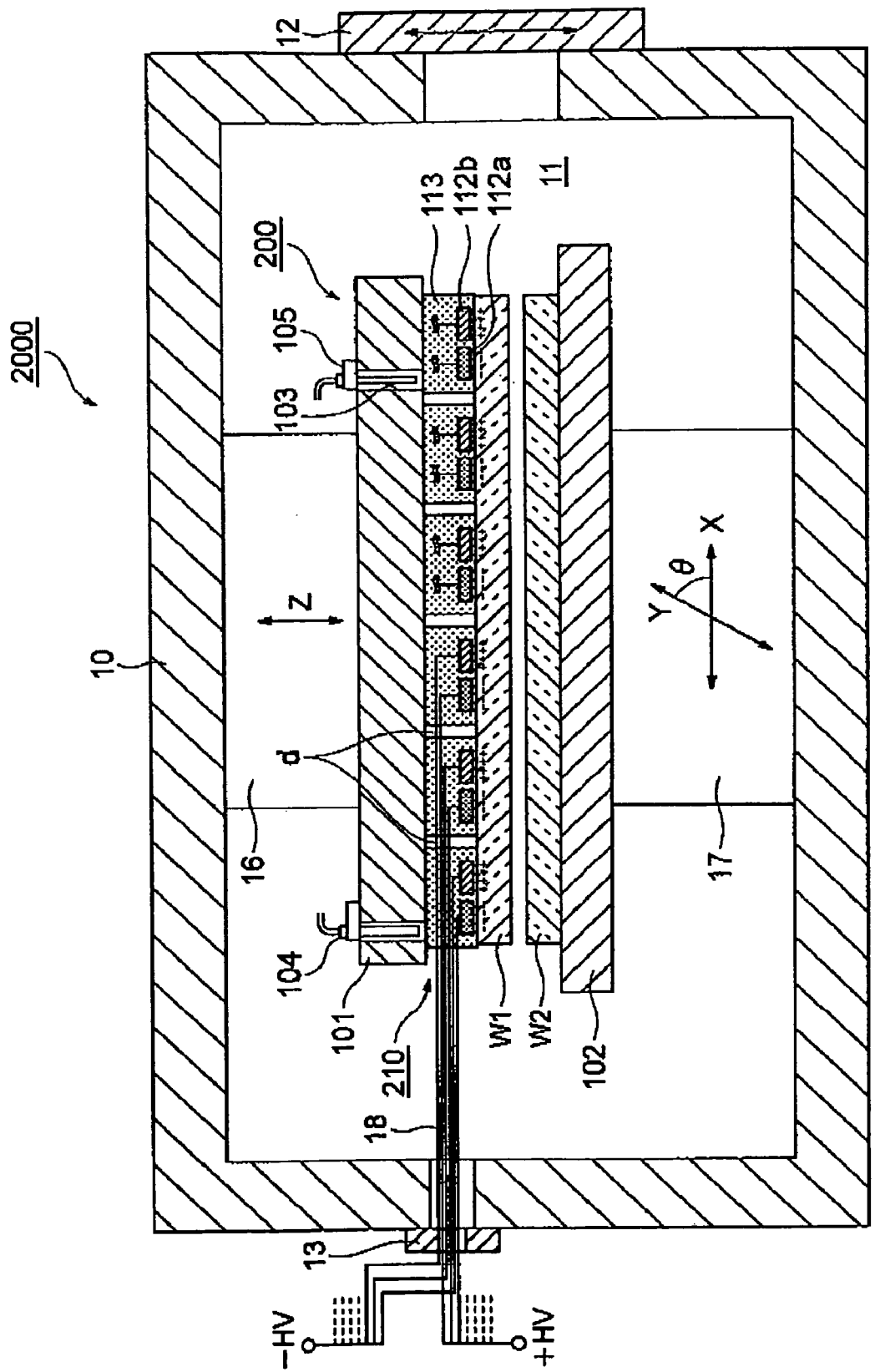
FIG. 4 is a view explaining a structure of a joining apparatus according to a fourth embodiment of the present invention.

FIG. 4 illustrates schematically a main portion of a joining apparatus 2000 as a modified example of the joining apparatus 1000 as shown in FIG. 1. Meanwhile, the identical reference numbers are attached to similar parts to that in the first embodiment for convenience of explanation, a detailed description thereof is omitted.

In FIG. 4, electrode modules 210 each having no a high-voltage generating part or high-voltage generating source, instead of the electrode module as shown in FIG. 2 or FIG. 3 are assembled.

That is to say, in each of the electrode modules 210 as shown in FIG. 4, the electrode element groups 112a, 112b are embedded in an insulative material 113 common to the basic member. The electrode element groups 112a, 112b are connected to lead wires 18, respectively. The lead wires 18 are connected through the flange part 13 to an exterior high-voltage generating source (−HV, +HV).

Thereby, even if the chamber 11 is decompressed or vacuumed rapidly, because the high-voltage generating part is disposed in an exterior portion, electric leak does not occur. If the holding surface 113a is failed for any reasons, even when only the failed electro module 210 is removed, it is required that the flange part 13 is removed and the tied lead wires 18 are released. In addition, if the electrode module 210 is attached, it is required that the released lead wires 18 are tied again.

Other operation and effect in the second to fourth embodiments are substantially the same as that in the first embodiment.

Meanwhile, to avoid complication of the working, if connectors to connect the lead wires 18 are disposed in the chamber 11, releasing and tying workings of the lead wires 18 are relaxed, and when the chamber 11 is vacuumed in a state where a high voltage is applied, electric leak occurs at a portion of the connector.

As mentioned above, although the embodiments of the present invention have been described with reference to the drawings, the present invention is not limited to these embodiments, even if the embodiments are changed in a scope of a gist of the present invention without departing therefrom, the changes are included in the present invention.

For example, an example of a contacting-type alignment has been described in the embodiment of the present invention, but alignment may be executed in a floating state. In this case, the alignment of the upper substrate or lower substrate may be executed in the floated holding state, and upper and lower electrostatic holding apparatuses may be used. A detail of the control is described, for example, in the specification of Japanese Patent Application No. 2004-283118 owned by the applicant of the present application. By controlling an input voltage supplied from a control circuit, it is possible to hold the upper substrate W1 to the holding surface 113a in a non-contact state, in other words, floating state. In this case, a holding device or supporting device capable of holding or supporting the upper substrate W1 in a floating state at a predetermined interval in the direction of z axis may be used, and thereby the alignment of the substrate is easy.

INDUSTRIAL APPLICABILITY

According to the joining apparatus or the electrostatic holding apparatus of the present invention, because electric leak does not occur even if the vacuuming is executed in a state where a high voltage occurs, the electrostatic holding apparatus or the like can be used for an alignment device, combining device or the like in combining a color filter substrate and a TFT substrate or the like. Otherwise, the electrostatic holding apparatus or the like according to the present invention can be applied to a producing process such as an assembled process of various electronic parts of a liquid crystal display apparatus or the like and a packing process or the like. Also, it is possible to expect development to wide utilization for an alignment device, a handling device, a transporting device or the like.

The invention claimed is:

1. An electrostatic holding apparatus, comprising:
   a plurality of electrode modules, each including:
      a holding surface configured to electrostatically hold an object on the holding surface;
      a high-voltage generating part provided on each of the plurality of electrode modules, the high-voltage generating part is configured to convert from a low voltage to a predetermined high voltage necessary to electrostatically hold the object, the high-voltage generating part being hermetically sealed, and the high-voltage generating part including a voltage amplifying circuit;
      a battery connected to the voltage amplifying circuit; and
      a switch provided between the battery and the voltage amplifying circuit, the switch being configured to be capable of being controlled from an exterior.

2. A vacuum environmental apparatus, comprising:
   an interior portion; and
   the electrostatic holding apparatus recited in claim 1 and provided in the interior portion.

3. An electrostatic holding apparatus, comprising:
   a plurality of electrode modules, each including:
      a holding surface configured to electrostatically hold an object on the holding surface;
      a high-voltage generating part provided on each of the plurality of electrode modules, the high-voltage generating part is configured to convert from a low voltage to a predetermined high voltage necessary to electrostatically hold the object, the high-voltage generating part being hermetically sealed, and the high-voltage generating part including a voltage amplifying circuit; and
      a connector for connecting to a low voltage source to supply the low voltage to the high-voltage generating part.

* * * * *